United States Patent [19]

Hudson et al.

[11] 4,150,330

[45] Apr. 17, 1979

[54] FUSE TESTER AND FLASHLIGHT

[76] Inventors: Theodore Hudson, c/o George Spector, 3615 Woolworth Bldg., 233 Broadway; George Spector, 3615 Woolworth Bldg., 233 Broadway, both of New York, N.Y. 10007

[21] Appl. No.: 713,098

[22] Filed: Aug. 10, 1976

[51] Int. Cl.² ............................................. G01R 31/00
[52] U.S. Cl. ...................................... 324/53; 362/204
[58] Field of Search .................. 324/53; 362/202–205

[56] References Cited

U.S. PATENT DOCUMENTS

| 2,830,173 | 4/1958 | Lambert | 362/205 |
| 2,882,388 | 4/1959 | Garland | 362/204 X |
| 2,902,643 | 9/1959 | Pasquale | 324/53 |
| 3,497,798 | 2/1970 | Schick | 324/53 |
| 3,711,768 | 1/1973 | Frazin | 324/53 |

Primary Examiner—John Gonzales

[57] ABSTRACT

A flashlight that additionally includes a circuit for testing out an electric fuse; the flashlight case having on its rear end a threaded socket into which a fuse can be screwed, and if the fuse is unbroken it will complete the circuit to the flashlight battery.

2 Claims, 3 Drawing Figures

U.S. Patent      Apr. 17, 1979      4,150,330
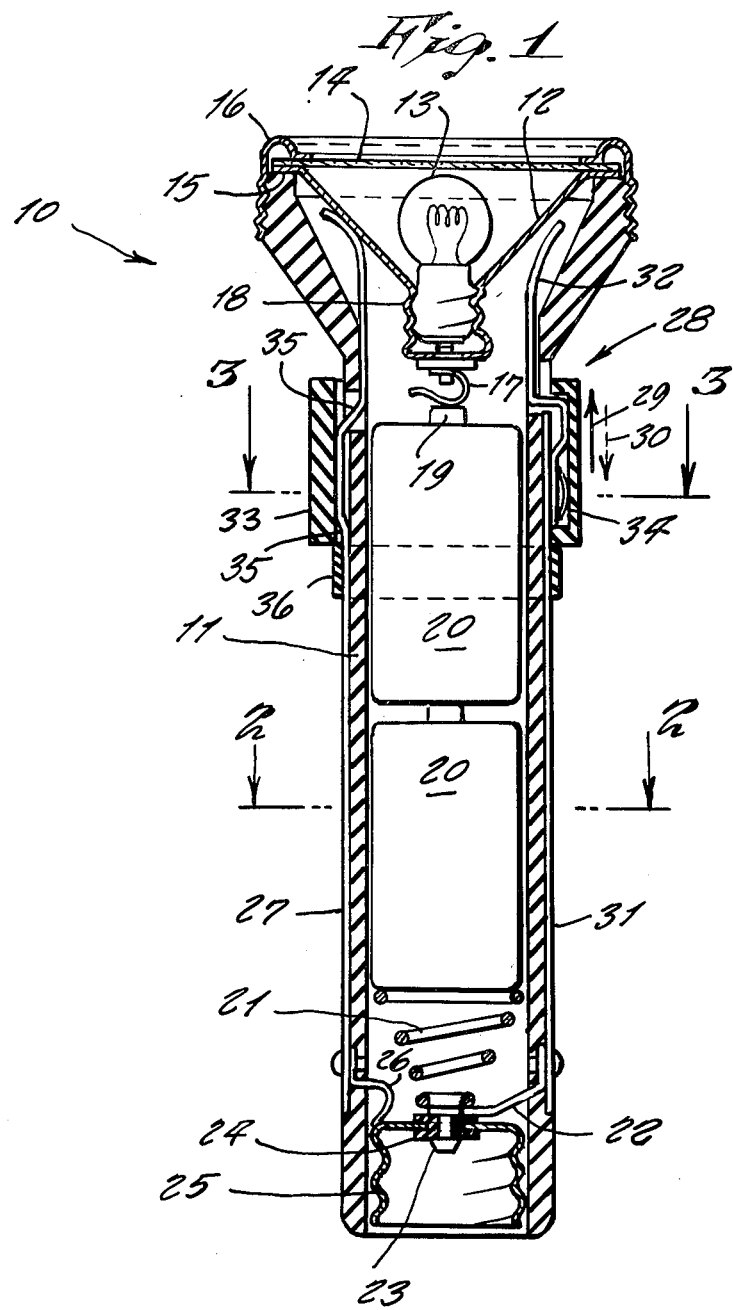
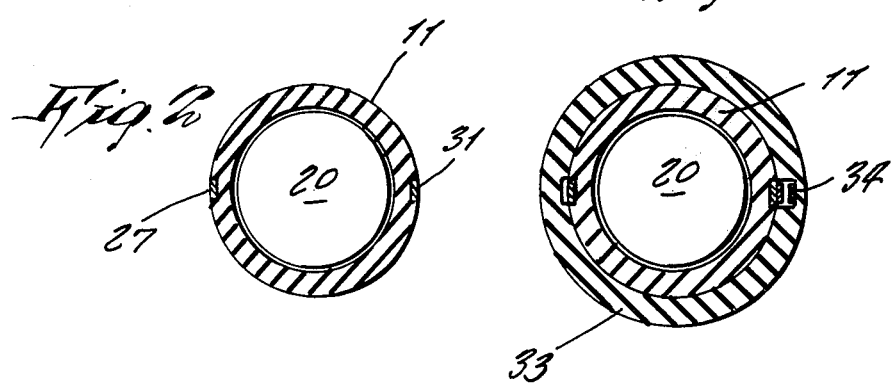

FUSE TESTER AND FLASHLIGHT

This invention relates generally to electric flashlights.

A principal object of the present invention is to provide a flashlight which additionally can serve as a fuse tester in order to find out if a fuse is burned out or if it is still unbroken and servicable.

Another object is to provide a fuse tester and flashlight comprising a combination tool in which flashlight illuminating service and fuse testing service are each independent of the other so that the implement can be used solely for either of the services.

Yet another object is to provide a fuse tester and flashlight in which an unobtrusive fuse socket is fitted in a rear end of the flashlight case for receiving a fuse being tested.

Other objects are to provide a fuse tester and flashlight which is simple in design, inexpensive to manufacture, rugged in construction, easy to use and efficient in operation.

These and other objects will be readily evident upon a study of the following specification and the accompanying drawing wherein:

FIG. 1 is a longitudinal cross section of the invention showing the various details.

FIG. 2 is a transverse cross-section thru line 2—2 of FIG. 1.

FIG. 3 is a transverse cross-section thru line 3—3 of FIG. 1.

Referring now to the drawing in detail, the reference numeral 10 represents a fust tester and flashlight according to the present invention wherein there is a cylindrical case 11 made of insulation and which at its forward end F is outwardly flared conically in order to receive a conical, metal reflector 12 in a center of which a lamp bulb 13 is screw threaded. A lens 14 is positioned against an outer side of a flange 15 of the reflector, and the reflector and lens are secured in the case by means of a metal bezel 16 screwed on the end of the case.

A center contact 17, supported in an insulated manner on an end of a threaded socket portion 18 of the reflector, engages a center pole 19 of a front of a plurality of dry cell batteries 2 contained within a center of the case 11. A compression coil spring 21 bears at one end against a rear end of the rearmost battery and serves as an electrical contact therebetween and a contact arm 22 engaging the other end of the spring. The contact arm also electrically contacts a center contact 23 held within an insulation 24 at a bottom of a metal, screw threaded socket 25 secured within a rear end of the case 11, and which is exposed so that a fuse can be screwed thereinto.

The metal socket 25 is connected to a conductor 26 connected to one end of a metal strip 27 fitted flush on the outer side of the case 11 and which at its other end permanently contacts a rear side of the reflector 12. Thus an electrical circuit is established from the batteries to the fuse socket 25.

A separate electric circuit is established between the batteries and lamp bulb, this circuit being manually controlled by a switch 28 slidable axially back and forth as indicated by arrows 29 and 30 and which includes a collar 33 around the outer side of the case. The contact arm permanently engages one end of a metal strip 31 located flush on an outer side of the case 11 and which can be on diametrically opposite side to the strip 27. The other end of the strip 31 engages a metal strip 32 that is slidably carried inside the collar so that an end of the sliding strip 32 can selectively contact a rear side of the reflector 12, thus closing a circuit through the lamp bulb in order to light up the same. An arcuately bent leaf spring 34 forces the strip 32 against a side of strip 31 in order to assure a good electrical engagement. The frictional force of spring 34, and a double bend 35 along the strip 27 frictionally hold the collar in any slided position. A circular band 36 rigidly secured to the outer side of the case serves as a stop for the rearward sliding travel of the collar; the outward flare of the case serving as a stop for the forward sliding travel of the collar.

In operative use, it is now evident that the switch 28 serves to turn the lamp bulb on. The circuit to the fuse is closed when an unbroken fuse is inserted into the fuse socket.

While various changes may be made in the detail construction, it is understood that such changes will be within the spirit and scope of the present invention as is defined by the appended claims.

What is claimed is:

1. In a fuse tester and flashlight, the combination of a cylindrical case of insulation, one end of said case being outwardly conically flared, a conical metal reflector inside said end, a lens over an end of said reflector and a bezel threaded on said case end, said bezel securing said reflector and lens, a lamp bulb screwed in a center of said reflector, a center terminal of a said bulb engaging a contact contacting a center post of a forward of a plurality of batteries inside said case wherein a rear terminal of a rearmost said batteries contacts a spring said spring being connected to a contact arm connected to a center contact of a fuse socket fitted in an opposite end of said case, said socket being connected to a conductor at one end of a conductive strip mounted longitudinally on the surface of said case, said strip at its opposite end contacting said reflector, said strip passing through a hole in said case to make contact with said reflector, wherein said contact arm contacts one end of a second conductive strip which at its other end slidably engages a third conductive strip carried in a slidable collar located around said case, said third strip having one end that is selectively engageable with said reflector when said collar is slid, relative to said case, said first strip having an outwardly bent portion surrounded and engaged by said collar resiliently to maintain said collar in a desired position.

2. The combination of claim 1, wherein, said second strip is mounted on the surface of said case spaced from said first strip, in further combination with a retaining spring in said collar compressed between said collar and said third strip whereby said collar is maintained in a desired position by said retaining spring and said bent portion.

* * * * *